(12) United States Patent
Goebel et al.

(10) Patent No.: US 7,064,373 B2
(45) Date of Patent: Jun. 20, 2006

(54) ARCHITECTURE AND FABRICATION METHOD OF A VERTICAL MEMORY CELL

(75) Inventors: Bernd Goebel, Dresden (DE); Stefan Slesazeck, Dresden (DE)

(73) Assignee: Infineon Technologies AG, Munich (DE)

( * ) Notice: Subject to any disclaimer, the term of this patent is extended or adjusted under 35 U.S.C. 154(b) by 124 days.

(21) Appl. No.: 10/829,982

(22) Filed: Apr. 23, 2004

(65) Prior Publication Data
US 2005/0036392 A1    Feb. 17, 2005

(30) Foreign Application Priority Data
Apr. 24, 2003  (DE) ................. 103 18 625

(51) Int. Cl.
*H01L 27/108* (2006.01)
(52) U.S. Cl. ........................ 257/301; 257/302
(58) Field of Classification Search ............ None
See application file for complete search history.

(56) References Cited

U.S. PATENT DOCUMENTS

| | | | |
|---|---|---|---|
| 6,436,836 B1 | 8/2002 | Göbel | |
| 6,627,940 B1 * | 9/2003 | Schumann et al. | 257/301 |
| 6,744,089 B1 * | 6/2004 | Wu | 257/301 |
| 2002/0017671 A1 | 2/2002 | Goebel et al. | |
| 2004/0201055 A1 | 10/2004 | Lutzen et al. | |

FOREIGN PATENT DOCUMENTS

| | | |
|---|---|---|
| DE | 199 41 401 C1 | 3/2001 |
| DE | 101 43 650 A1 | 3/2003 |

\* cited by examiner

*Primary Examiner*—Tu-Tu Ho
(74) *Attorney, Agent, or Firm*—Slater & Matsil, L.L.P.

(57) ABSTRACT

A vertical memory cell comprises a storage capacitor, the inner electrode of which is formed in a deep trench, and a vertical selector transistor. The selection transistor has an upper source/drain region and a lower source/drain region, which has emerged by outdiffusion of a dopant from the inner electrode. A gate electrode, which in each case controls a current flow between two assigned source/drain regions, is formed, in segments, as a segment of an addressing line arranged row-wise in active trenches. The provision of an auxiliary structure in the active trenches enables the addressing lines to be vertically positioned in the active trenches independently of a depth of the active trenches. Leakage currents which occur in overlap regions of the addressing lines with the inner electrode or the lower source/drain region are reduced.

19 Claims, 7 Drawing Sheets

ARCHITECTURE AND FABRICATION METHOD OF A VERTICAL MEMORY CELL

FIELD

The present invention relates generally to semiconductor devices and in particular to vertical memory cells for semiconductor memory.

BACKGROUND

The size and performance of DRAM (Dynamic Random Access Memory) memory cells substantially depend on leakage currents of a memory cell comprising a selector transistor and a storage capacitor. The leakage currents of the storage capacitor decrease an electrical charge that characterizes a data content in the storage capacitor. After a time interval dependent on the magnitude of the leakage currents, the stored electrical charge in the storage capacitor is reduced to an extent such that the storage capacitor must be charged again in order to preserve the data content. This time interval is also referred to as the retention time, a short retention time signifying frequent recharging of the storage capacitor. The more frequently the storage capacitors have to be recharged, the more energy is consumed. Moreover, frequent recharging delays access times to data contents. Therefore, it is desirable to keep the retention time as long as possible.

The retention time is proportionally dependent on the storage capacitance of the storage capacitor and inversely dependent on the magnitude of the leakage currents. Thus, the higher the storage capacitance of the storage capacitor, the longer the retention time, and the higher the leakage currents that occur, the shorter the retention time. Since an increase in the storage capacitance of the storage capacitor is usually accompanied by an enlargement of an overall size of the memory cell, it is desirable to reduce the leakage currents that occur in the memory cell.

In vertical memory cells, the storage capacitor is formed in a deep trench in a semiconductor substrate. The selection transistor is oriented vertically with respect to the substrate surface and arranged essentially between the substrate surface and the storage capacitor. The connection of the storage capacitor to the selection transistor is formed by an outdiffusion of dopant from a polysilicon that forms an inner electrode of the storage capacitor. The outdiffusion results in a lower source/drain region of the selection transistor. In the case of a DRAM memory comprising vertical memory cells, the individual memory cells are arranged next to one another in rows. Adjacent rows are separated from one another in each case by an active trench. The active trenches are in each case to be provided with a depth such that lower source/drain regions of memory cells of adjacent rows are electrically isolated from one another. Gate electrodes assigned to the selection transistors are in each case formed at least in segments in the active trenches, the gate electrodes of adjacent selection transistors in a row adjoining one another and forming addressing lines. In this case, the addressing lines are provided in the active trenches, in a known manner, as spacer structures situated on a bottom of the active trenches. Since the active trenches extend to below an upper edge of the inner electrodes, there is an overlap between segments of the gate electrode, or the addressing lines, and the inner electrode of the storage capacitor. Such an overlap results in a disadvantageous leakage current from the storage capacitor.

A further leakage current is induced by the gate electrode in a switched-off state of a selection transistor. This leakage effect is also referred to as the GIDL effect (Gate Induced Drain Leakage). The GIDL effect is based on a strong band bending—occurring in the switched-off state of the selection transistor—in an overlap region between the gate electrode and the source/drain region. The GIDL effect and thus the magnitude of the leakage current can be reduced by reducing a source/drain overlap region between the gate electrode and the highly doped lower source/drain region.

SUMMARY

An embodiment of the present invention provides a memory cell having a low leakage current, said memory cell comprising a storage capacitor arranged in a deep trench in a semiconductor substrate and a vertical selection transistor with respect to the substrate surface.

The memory cell comprises a storage capacitor, which is formed in a deep trench introduced into a semiconductor substrate. The memory cell has an inner electrode arranged in the deep trench, as well as a selection transistor, which is formed essentially between the substrate surface of the semiconductor substrate and an upper edge of the inner electrode of the storage capacitor. The selection transistor comprises a lower source/drain region connected to the inner electrode, an upper source/drain region oriented with respect to the substrate surface, and a gate electrode, which controls a current flow between the two source/drain regions and is formed, at least in segments, as a segment of an addressing line. The addressing line is arranged in active trenches that extend from the substrate surface to below the upper edge of the inner electrode and insulate adjacent memory cells from one another.

An auxiliary structure is provided in each case in the active trenches, which auxiliary structure essentially extends from a bottom of an active trench approximately as far as the upper edge of the inner electrodes. The addressing lines are formed between the substrate surface and the upper edge of the inner electrode.

In another embodiment, a method for fabricating memory cells comprises forming a selection transistor and a storage capacitor in an active trench in a semiconductor substrate, in which the deep trenches are introduced into the semiconductor substrate from a substrate surface. An inner electrode of one of the storage capacitors is in each case arranged in a lower region of one of the deep trenches. A capacitor termination is in each case provided on the inner electrodes. Active trenches that extend at least as far as the capacitor terminations and insulate memory cells arranged in adjacent rows from one another are introduced from the substrate surface. Addressing lines for driving the selection transistors are formed in the active trenches. Before the addressing lines are formed, the active trenches are filled with an auxiliary structure up to an auxiliary filling height. The addressing lines are subsequently formed essentially above the auxiliary filling height. A lower edge of the addressing lines is thus aligned by way of the choice of the auxiliary filling height.

DETAILED DESCRIPTION OF THE PREFERRED EMBODIMENTS

The following list of symbols is used consistently throughout the text and drawings.

LIST OF REFERENCE SYSBOLS

Figure 1A:
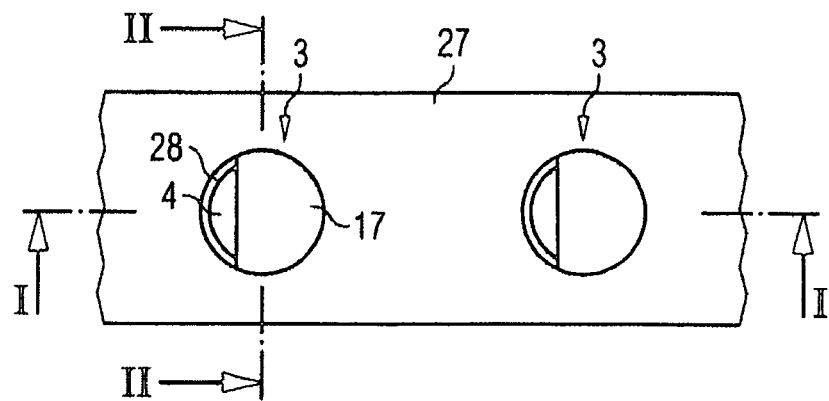
FIG. 1a illustrates a top view of a structure containing deep trenches for memory cells after the formation of storage capacitors, according to an exemplary embodiment of the present invention.
Figure 1B:
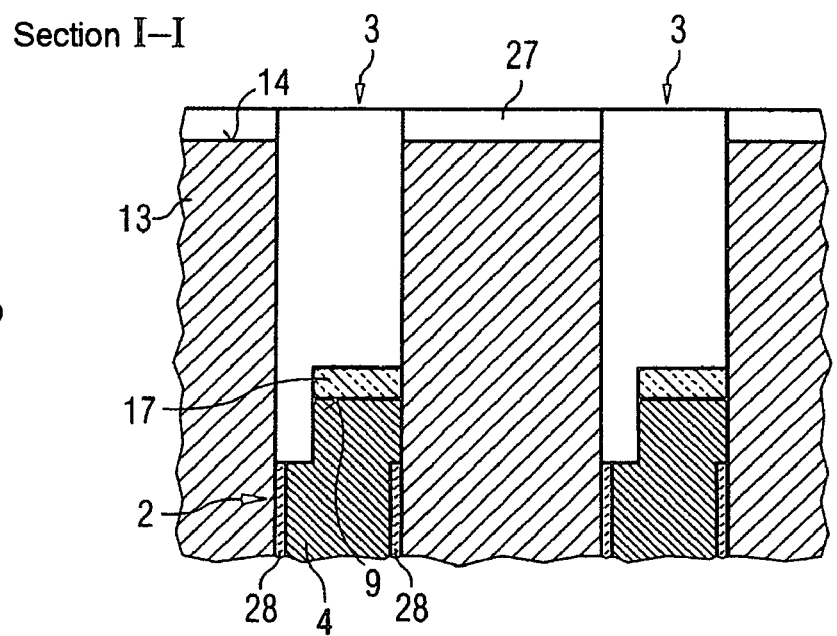
FIG. 1b illustrates a cross-sectional view along I—I direction of FIG. 1a showing deep trenches for memory cells after the formation of storage capacitors, according to an exemplary embodiment of the present invention.
Figure 1C:
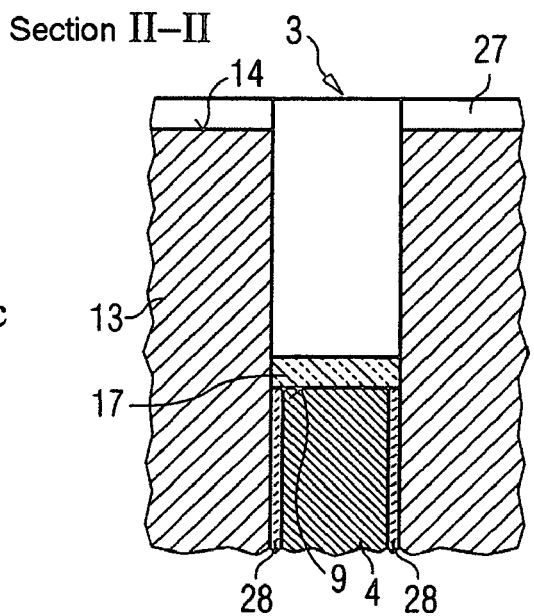
FIG. 1c illustrates a cross-sectional view along II—II direction of FIG. 1a showing deep trenches for memory cells after the formation of storage capacitors, according to an exemplary embodiment of the present invention.

1 Memory cell
2 Storage capacitor
3 Deep trench
4 Inner electrode
6 Selection transistor
7 Lower source/drain region
7' Upper source/drain region
8 Gate electrode
9 Upper edge
10 Active trench
11 Addressing line
12 Lower edge
13 Semiconductor substrate
14 Substrate surface
15 Auxiliary structure
16 Bottom of active trench
17 Capacitor termination
18 Source/drain overlap region
19 Supporting structure
20 Liner layer
21 Sacrificial spacer structures
22 Protective layer
23 Gate oxide
24 Hard mask
25 Gap
26 Insulating material
27 Auxiliary layer
28 Dielectric layer
29 First segment of gate electrode
30 Second segment of gate electrode
HHS Height of auxiliary structure
HWL Height of addressing line FIGS. 1a–1c illustrate various views of a structure containing deep trenches for memory cells after the formation of storage capacitors, according to an exemplary embodiment of the present invention. A semiconductor substrate 13 is provided with deep trenches 3 arranged in rows, storage capacitors 2 for memory cells 1 being formed in said deep trenches. Two adjacent deep trenches 3—arranged in a row—with storage capacitors 2 in a semiconductor substrate 13 are illustrated in FIG. 1a in the plan view and in FIGS. 1a and 1b in the sectional planes designated by I and II, respectively. The sectional plane I runs along a row and shows two adjacent deep trenches 3. The sectional plane II runs perpendicular to the sectional plane I and shows one deep trench 3, which is still entirely encapsulated by the semiconductor substrate 13 in this processing stage. An inner electrode 4 of storage capacitor 2 formed in deep trench 3 is surrounded by a dielectric layer 28. An upper edge 9 of inner electrode 4 is covered with a doped insulator layer serving as a capacitor termination 17. n a region below upper edge 9, inner electrode 4, preferably comprising polysilicon, directly adjoins semiconductor substrate 13. In this region, a lower source/drain region 7 of a selection transistor 6 (see FIG. 7b) is formed by outdiffusion of a dopant from the polysilicon. An auxiliary layer 27 is applied on substrate surface 14.

Figure 2A:
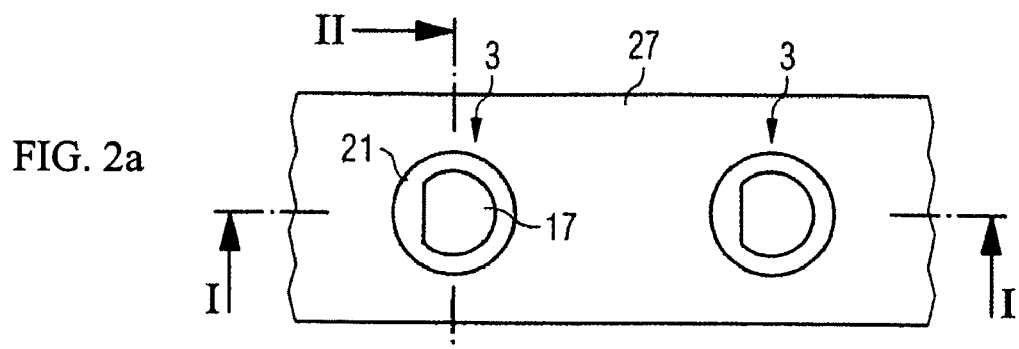
FIG. 2a illustrates a top down view of deep trenches for memory cells after the application of sacrificial spacers, according to an exemplary embodiment of the present invention.
Figure 2B:
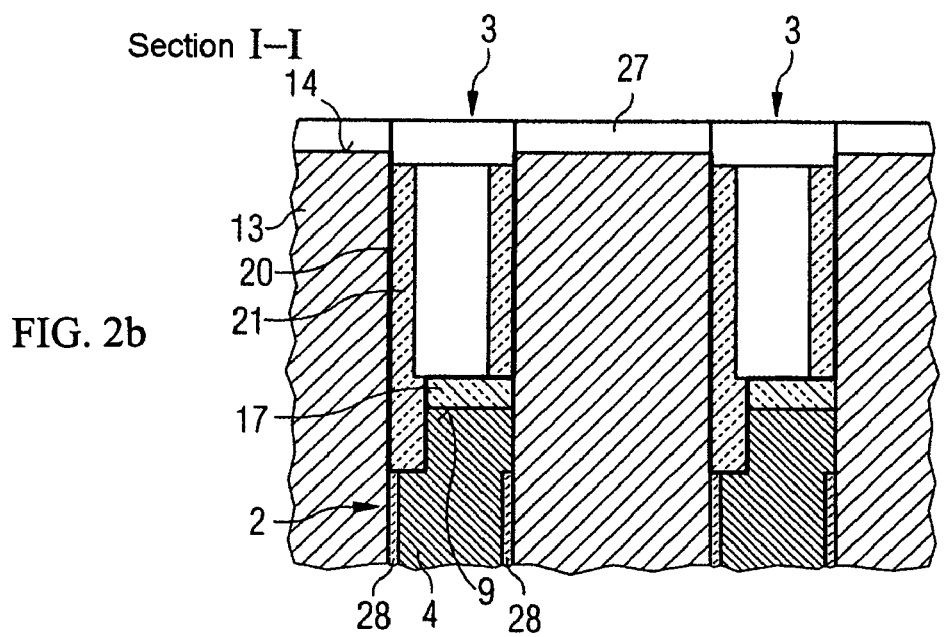
FIG. 2b illustrates a cross-sectional view of deep trenches along direction I—I of FIG. 2a for memory cells after the application of sacrificial spacers, according to an exemplary embodiment of the present invention.
Figure 2C:
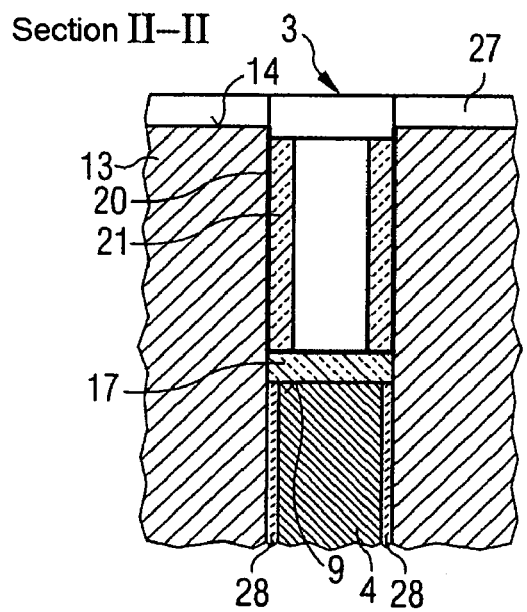
FIG. 2c illustrates a cross-sectional view of deep trenches along direction II—II of FIG. 2a for memory cells after the application of sacrificial spacers, according to an exemplary embodiment of the present invention.

FIGS. 2a–2c illustrate deep trenches 3 with storage capacitors 2 and sacrificial spacer structures 21. Sidewalls of deep trenches 3 are first provided with a liner layer 20 above capacitor terminations 17. Afterward, sacrificial spacer structures 21 are formed, for instance by conformal deposition and anisotropic etching-back.

Figure 3A:
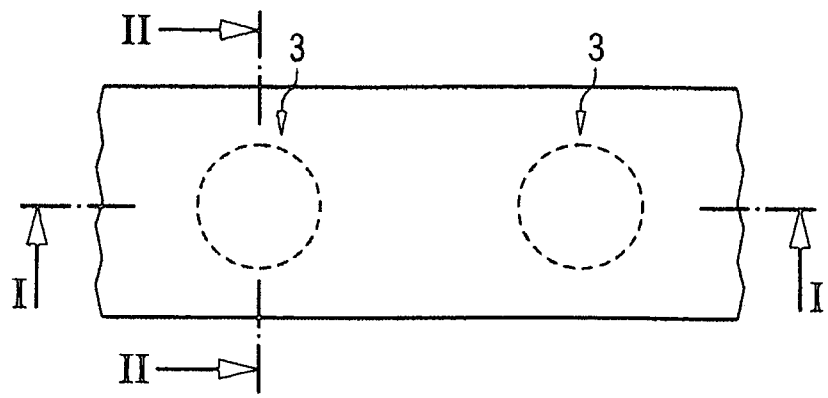
FIG. 3a illustrates a top down view of deep trenches for memory cells after the introduction of supporting structures, according to an exemplary embodiment of the present invention.
Figure 3B:
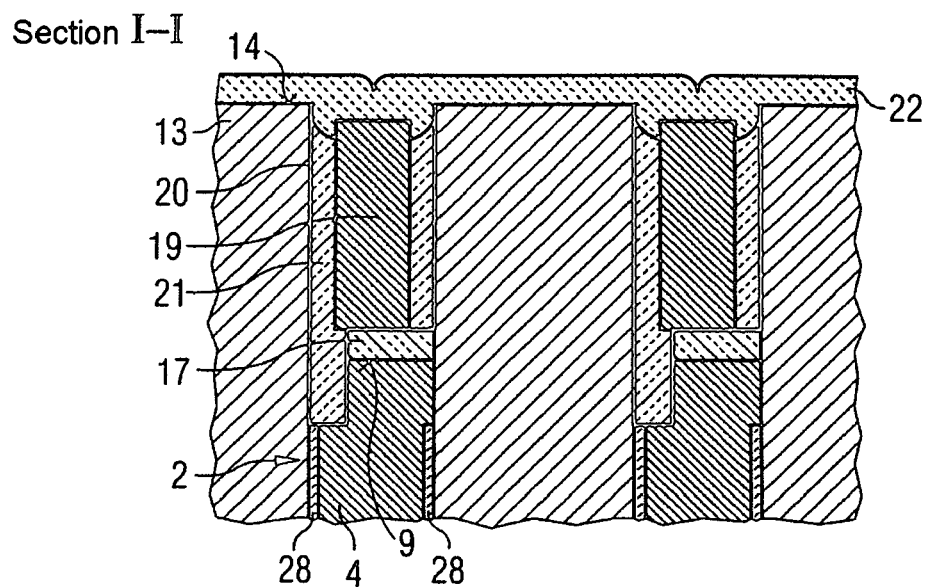
FIG. 3b illustrates a cross-sectional view along direction I—I of FIG. 3a for deep trenches for memory cells after the introduction of supporting structures, according to an exemplary embodiment of the present invention.
Figure 3C:
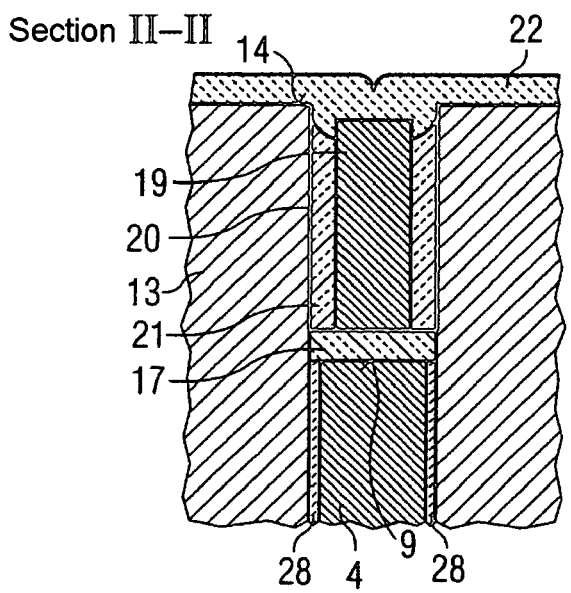
FIG. 3c illustrates a cross-sectional view along direction II—II of FIG. 3a for deep trenches for memory cells after the introduction of supporting structures, according to an exemplary embodiment of the present invention.

FIGS. 3a–3c illustrate supporting structure 19. Sacrificial spacer structure 21 has been etched back directly under substrate surface 14. Active trenches 3 that are lined with sacrificial spacer structures 21 above capacitor termination 17 are filled with a supporting structure 19. Supporting structure 19 preferably comprises polysilicon, while sacrificial spacer structure 21 comprises a borosilicate glass. These two materials have a high etching selectivity with respect to one another, which entails an advantage during further processing. Substrate surface 14 is provided with a protective layer 22, which also extends over trenches 3 filled with sacrificial spacer structure 21 and supporting structure 19.

Figure 4A:
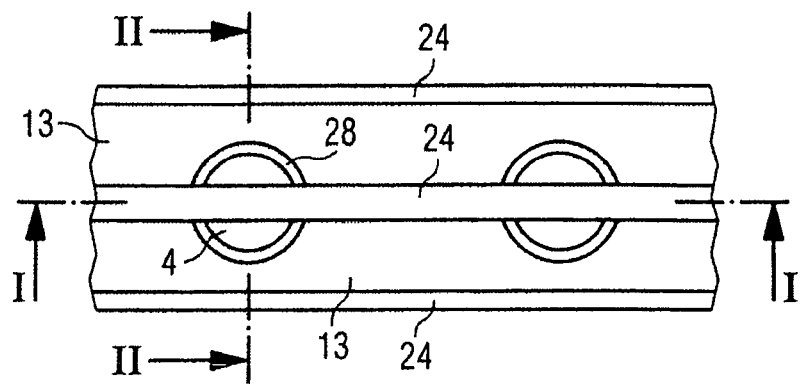
FIG. 4a illustrates a top down view of deep trenches for memory cells after the introduction of active trenches, according to an exemplary embodiment of the present invention.
Figure 4B:
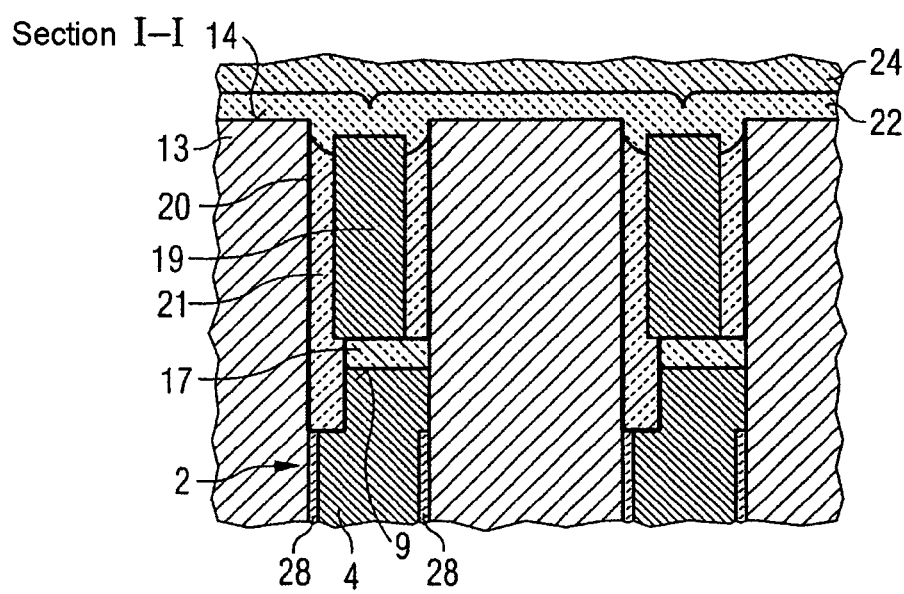
FIG. 4b illustrates a cross-sectional view of deep trenches along direction I—I for memory cells after the introduction of active trenches, according to an exemplary embodiment of the present invention.
Figure 4C:
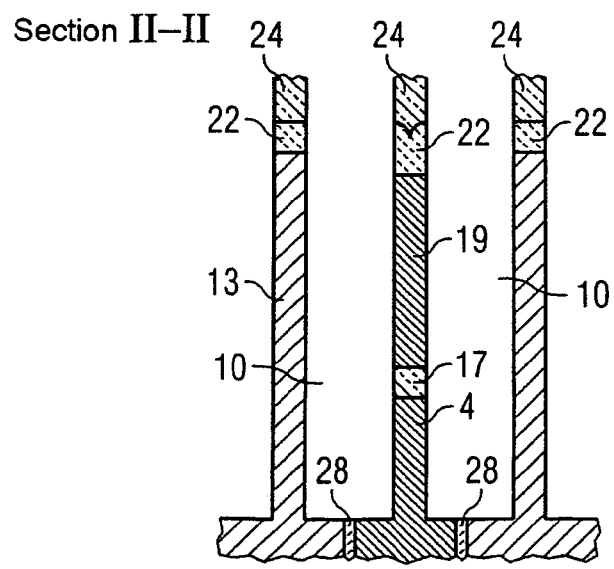
FIG. 4c illustrates a cross-sectional view of deep trenches along direction I—I for memory cells after the introduction of active trenches, according to an exemplary embodiment of the present invention.

FIGS. 4a–4c illustrates trench structures after formation of hard mask 24. Hard mask 24 is applied to protective layer 22 for the purpose of fastening active trenches 10 which separate the respective adjacent rows of memory cells. Active trenches 10 are subsequently etched into semiconductor substrate 13.

Active trenches 10 can be seen in the sectional plane which runs perpendicular to the rows and is designated by II. They extend from substrate surface 14 to below upper edge 9 of inner electrode 4. Active trench 10 must have a minimum depth in order that lower source/drain regions 7—outdiffused from the polysilicon of inner electrode 4—of selection transistors 6 which are arranged in adjacent rows are reliably insulated from one another.

Figure 5A:
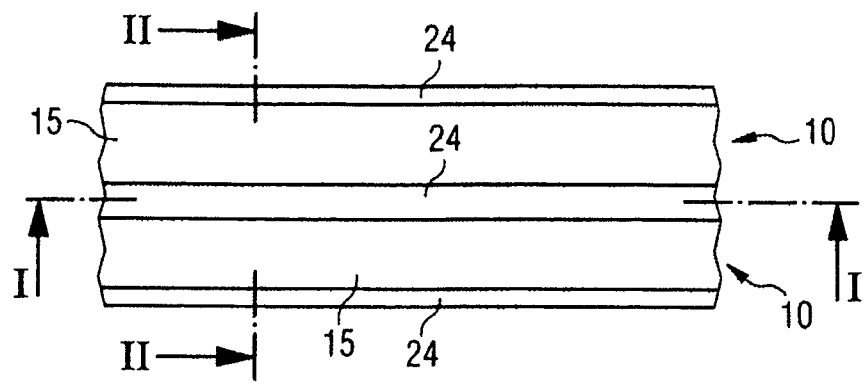
FIG. 5a illustrates a top down view of deep trenches for memory cells after the filling of active trenches with an auxiliary structure, according to an exemplary embodiment of the present invention.
Figure 5B:
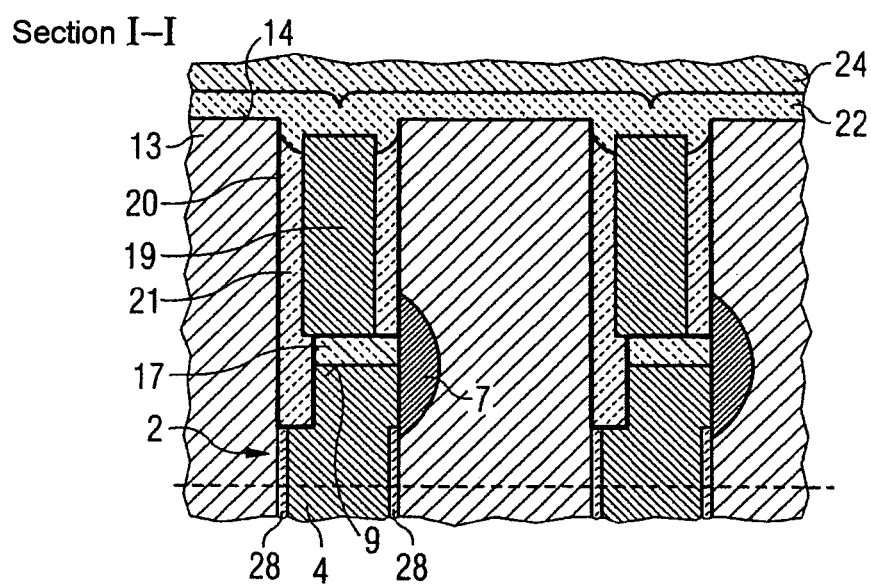
FIG. 5b illustrates a cross-sectional view of deep trenches along direction I—I for memory cells after the filling of active trenches with an auxiliary structure, according to an exemplary embodiment of the present invention.
Figure 5C:
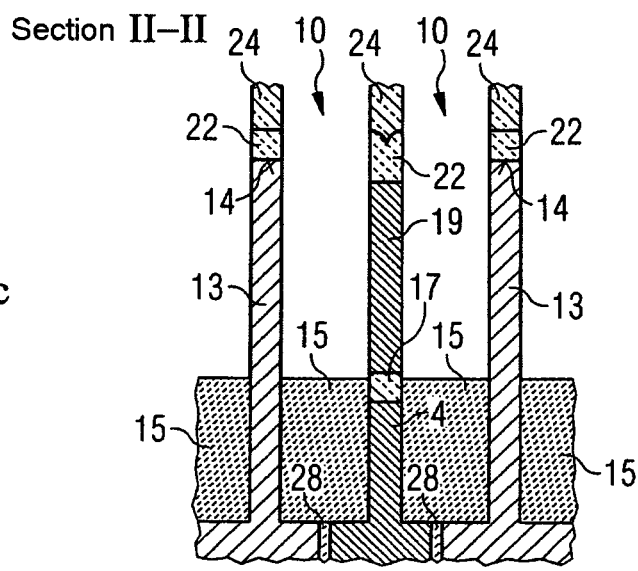
FIG. 5c illustrates a cross-sectional view of deep trenches along direction II—II for memory cells after the filling of active trenches with an auxiliary structure, according to an exemplary embodiment of the present invention.

FIGS. 5a–5c illustrate outdiffused source/drain region 7 and auxiliary structure 15. A positioning of gate electrodes 8 to be formed in active trenches 10 is varied by means of the introduction of auxiliary structure 15 into active trenches 10. In this exemplary embodiment, auxiliary structure 15 reaches as far as the upper edge of capacitor termination 17.

Figure 6A:
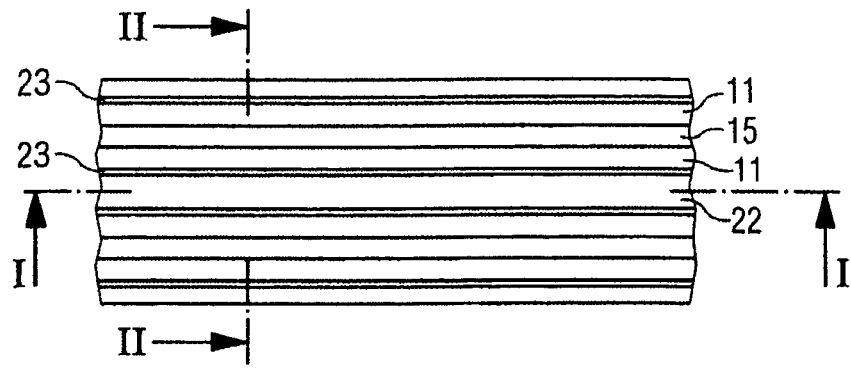
FIG. 6a illustrates a top down view of deep trenches for memory cells after the formation of gate electrodes, according to an exemplary embodiment of the present invention.
Figure 6B:
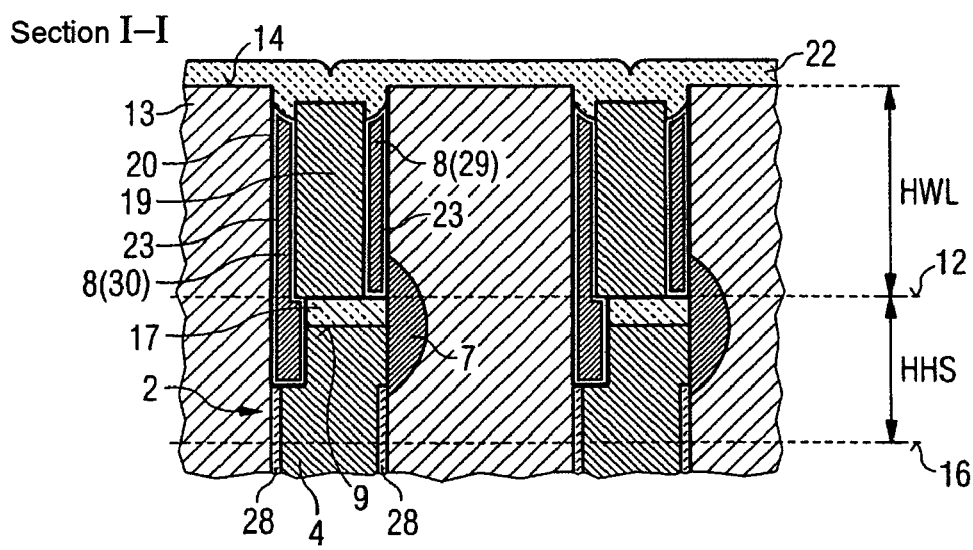
FIG. 6b illustrates a cross-sectional view of deep trenches along direction I—I for memory cells after the formation of gate electrodes, according to an exemplary embodiment of the present invention.
Figure 6C:
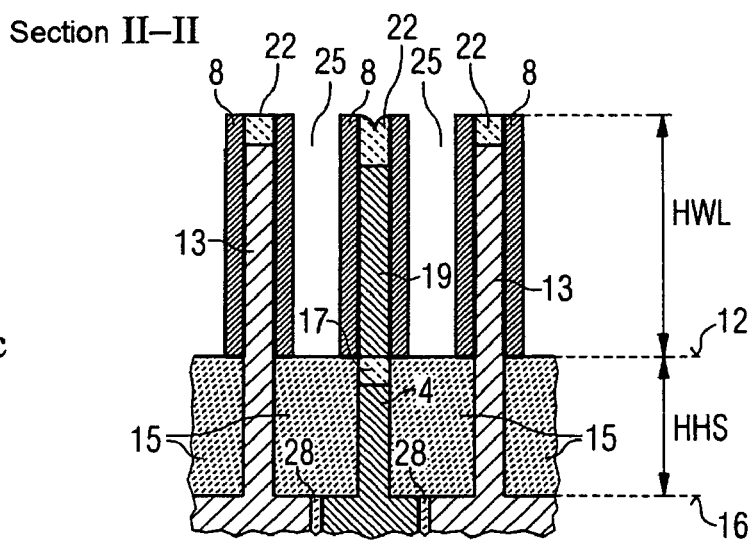
FIG. 6c illustrates a cross-sectional view of deep trenches along direction II—II for memory cells after the formation of gate electrodes, according to an exemplary embodiment of the present invention.

After the removal of hard mask 24 and sacrificial spacer structures 21, firstly a gate oxide 23 is provided in the resulting gaps and in the upper parts of active trenches 10 and then a gate electrode material is applied. Afterward, in active trenches 10, addressing lines 11 are produced from the gate electrode material and further segments of gate electrodes 8 are produced in the gaps produced by the removal of sacrificial spacer structures 21, as depicted in FIGS. 6a–6c.

Gate electrodes 8, which are surrounded by a gate oxide 23 and end in a region below substrate surface 14, are illustrated in the sectional drawing I in FIG. 6c. A first segment 29 of a gate electrode 8 of a first memory cell 1 and a second segment 30 of a gate electrode 8 of a second memory cell 1 in each case lie opposite one another in deep trenches 3. Segments 29, 30 of gate electrodes 8 are insulated from one another by supporting structure 19. The sectional drawing identified by II—II shows addressing lines 11 which are situated in active trench 10, comprise gate electrodes 8 in segments and extend in a manner bearing on auxiliary structure 15 as far as the upper termination of protective layer 22, thus defining the height of addressing line 11, HWL. Adjacent addressing lines 11 are insulated from one another by a gap 25. In order to avoid an overlap between gate electrode 8 and inner electrode 4 of storage capacitor 2, the height of the auxiliary structure 15, HHS, is provided in such a way that auxiliary structure 15 reaches from the bottom of active trench 10 as far as the upper edge of capacitor termination 17. Segments 29, 30 of gate electrodes 8, together with associated segments of addressing lines 11, enclose an active region of a selection transistor 6 (see FIG. 7b).

A source/drain overlap region 18 can be varied with the height of auxiliary layer 15 HHS. If HHS is increased, then source/drain overlap region 18 is reduced. A reduction of source/drain overlap region 18 results in a reduction of leakage currents. However, the resistance at lower source/drain region 7 is thereby increased. In this exemplary embodiment, this disadvantage is counteracted by the introduction of a weakly doped region. The weakly doped region is produced by outdiffusion from capacitor termination 17. The weakly doped region extends lower source/drain region 7 in the direction of substrate surface 14.

Figure 7A:
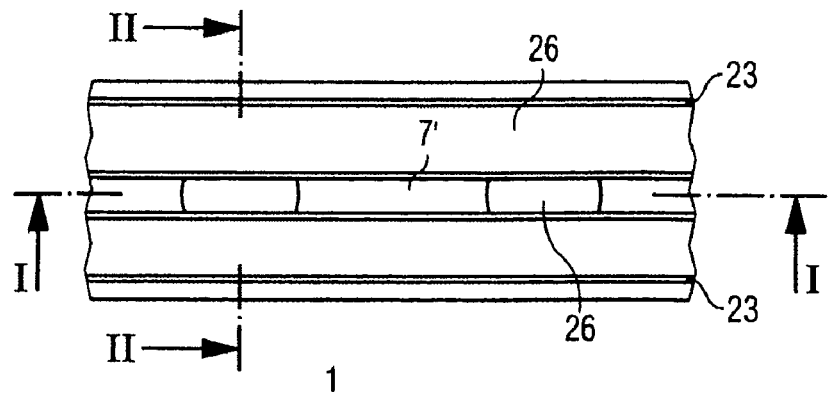
FIG. 7a illustrates a top down view of deep trenches for memory cells after the production of upper source/drain regions, according to an exemplary embodiment of the present invention.
Figure 7B:
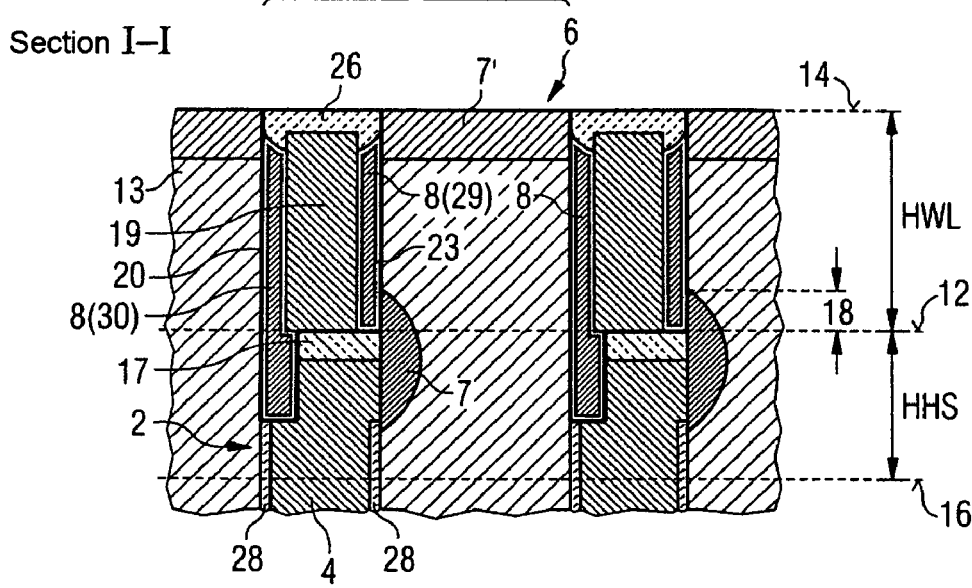
FIG. 7b illustrates a cross-sectional view of deep trenches along direction I—I for memory cells after the production of upper source/drain regions, according to an exemplary embodiment of the present invention.
Figure 7C:
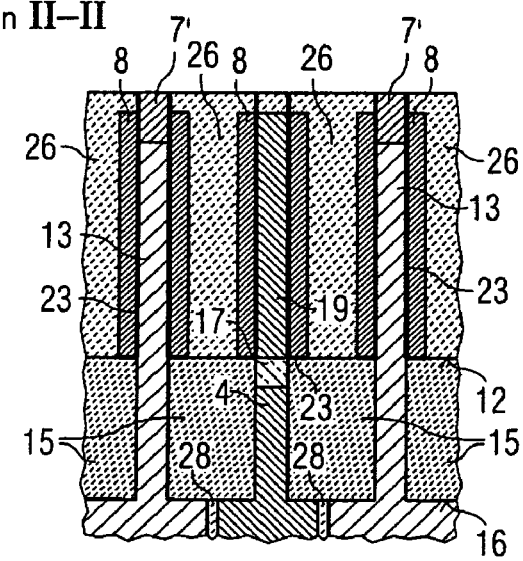
FIG. 7c illustrates a cross-sectional view of deep trenches along direction II—II for memory cells after the production of upper source/drain regions, according to an exemplary embodiment of the present invention.

FIG. 7b reveals source/drain overlap region 18 between gate electrode 8 and lower source/drain region 7. After the removal of protective layer 22, upper source/drain regions 7' of selection transistors 6 of memory cells 1 are doped by means of inclined implantation. Since gate electrodes 8 end below substrate surface 14, they support an alignment of the inclined implantation. The resulting gaps 25 and other cavities are subsequently filled with an insulating material 26.

Accordingly, embodiments of the present invention provide a vertical memory cell with controllable overlap between a gate electrode and an adjacent storage capacitor. An electrode overlap region between the gate electrode, or the addressing line, and the inner electrode of the storage capacitor, which is conventionally determined by a depth of the active trench relative to the upper edge of the inner electrode, is thus variable. The auxiliary structure according to the invention thus advantageously decouples a vertical positioning of the addressing lines and thus the extent of the electrode overlap region from a required depth of the active trenches for insulation from memory cells arranged in adjacent rows. A height of the auxiliary structure is preferably chosen such that the electrode overlap region is minimized or completely avoided. This leads to a significant reduction of the leakage currents from the storage capacitor and thus to an increase in the retention time. The energy consumption of the memory cell is reduced and the access times to stored data contents are shortened.

The memory cell furthermore has a source/drain overlap region between the addressing line and the lower source/drain region which can be set independently of the depth of the active trenches.

Since the vertical positioning of the addressing lines can be controlled with the height of the auxiliary structure, it is possible to reduce or enlarge the overlap region between the source/drain region and the addressing line. A reduction of the source/drain overlap region is advantageous in order to reduce a leakage current portion based on the GIDL effect. However, the reduction of the source/drain overlap region leads to an increased source/drain resistance.

Therefore, according to a particularly preferred embodiment of the present invention, provision is made for providing a capacitor termination arranged on the inner electrode of the storage capacitor as a doped insulator layer. The lower source/drain region of the memory cell according to the invention consequently comprises a weakly doped region produced by an outdiffusion from the doped insulator layer. The weakly doped region reduces a resistance assigned to the lower source/drain region.

The memory cells are in each case arranged next to one another in rows. The memory cells of respectively adjacent rows are separated from one another by the active trenches.

Within a row, the memory cells are arranged according to the invention in such a way that in each case a first segment of a gate electrode assigned to the first memory cell and a second segment of a gate electrode assigned to a second memory cell adjacent to the first memory cell along the addressing line are arranged in a deep trench assigned to a first memory cell.

Thus, segments of gate electrodes which are assigned to two different memory cells are in each case formed in the deep trenches.

A supporting structure is provided between the first segment of the first gate electrode and the second segment of the second gate electrode. The supporting structure has a high etching selectivity with respect to borosilicate glass. This results in a process engineering advantage in the production of the gate electrodes, or the addressing lines.

In another embodiment of the present invention provides a method to control the electrode overlap region between an inner electrode and an addressing line. This is preferably accomplished by the choice of an auxiliary filling height.

In a similar manner, the choice of the auxiliary filling height can be used to set a source/drain overlap region between a respective one of the addressing lines and an assigned source/drain region.

The advantage of the method according to the invention is that the electrode overlap region and the source/drain overlap region become adjustable and, consequently, leakage currents of the memory cell can advantageously be minimized.

In a particularly advantageous manner, the active trenches are filled with the auxiliary structures essentially as far as the capacitor termination.

Filling the active trenches as far as the capacitor termination avoids an overlap between the inner electrode of the storage capacitor and the addressing line. The leakage current from the storage capacitor is thereby minimized.

The capacitor terminations are in each case provided as a doped insulator layer. Weakly doped regions which in each case extend the lower source/drain regions in the direction of the upper source/drain regions are then formed in each case by outdiffusion from the doped insulator layer. This results in a better orientation of the lower source/drain region with respect to the gate electrode whilst simultaneously minimizing the leakage currents.

After the provision of the capacitor terminations, according to the invention, sacrificial spacer structures extending along sidewalls of the deep trenches are formed in each case above the capacitor termination. The deep trenches provided with the sacrificial spacer structures above the capacitor termination are in each case filled with a supporting structure. After the introduction of the active trenches, the sacrificial spacer structures are removed, voids remaining instead of the sacrificial spacer structures. Afterward, the active trenches and the voids are in each case lined at least in segments with a gate oxide. A gate electrode material is then applied, which simultaneously fills the active trenches and the voids produced by the removal of the sacrificial spacer structures. The addressing lines are formed in the active trenches in a known manner by means of a spacer etching, which addressing lines form gate electrodes in segments together with segments arranged in the former voids.

The supporting structure preferably comprises polysilicon, which has a high etching selectivity with respect to the sacrificial spacer structure preferably comprising a borosilicate glass. The provision of the sacrificial spacer structures makes it possible, after the removal thereof, to simultaneously form both the gate electrode segments arranged in the deep trenches and the gate electrode segments arranged in the active trenches.

Before the sacrificial spacer structures are formed, a liner layer is applied at least to the sidewalls of the deep trenches in each case above the capacitor termination.

The sacrificial spacer structures emerge from a deposition of a dielectric material and an anisotropic etching-back of the dielectric material to below the substrate surface.

The material of the addressing lines is patterned by means of an anisotropic etching step, so that, in a respective one of the active trenches, mutually opposite addressing lines are separated from one another by a gap.

Since the active trenches in each case separate the memory cells arranged in rows from one another, it is necessary for the two addressing lines which in each case run parallel in an active trench to be insulated from one another by the gap. The gap is therefore filled with an insulating material. Afterward, the addressing lines are in each case caused to recede to below the substrate surface, and the upper source/drain regions are formed in the semiconductor substrate relative to an upper edge of the addressing lines.

An inclined implantation of the semiconductor substrate with a dopant, aligned by means of the upper edge of the addressing lines, is carried out in order to form the upper source/drain regions.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A vertical memory cell array containing at least one vertical memory cell, the memory cell comprising:

a storage capacitor formed in a deep trench in a semiconductor substrate and containing an inner electrode arranged in the deep trench;

a selection transistor formed essentially between the substrate surface of the semiconductor substrate and an upper edge of the inner electrode;

a lower source/drain region in the selection transistor connected to the inner electrode and an upper source/drain region;

a selection transistor gate electrode formed, at least in segments, as segments of an addressing line arranged in active trenches that extend from the substrate surface to below the upper edge of the inner electrode and insulate adjacent memory cells from one another; and an auxiliary structure extending essentially from a bottom of an active trench as far as the upper edge of the inner electrode, wherein the addressing line is formed in the region between the substrate surface and the upper edge of the auxiliary structure.

2. The vertical memory cell array of claim 1, wherein through the choice of a height of the auxiliary structure, the source/drain overlap region between the addressing line and the lower source/drain region is controlled.

3. The vertical memory cell array of claim 1, wherein a doped insulator layer is provided as capacitor termination on the inner electrode.

4. The vertical memory cell array of claim 3, wherein the lower source/drain region comprises a weakly doped region produced by an outdiffusion from the doped insulator layer.

5. The vertical memory cell array of claim 1, wherein a plurality of memory cells are arranged in rows separated from one another by the active trenches.

6. The vertical memory cell array of claim 5, wherein a first segment of a gate electrode assigned to a first memory cell and a second segment of a gate electrode assigned to a second memory cell that is adjacent to the first memory cell in the same row are arranged in a deep trench assigned to a first memory cell.

7. The vertical memory cell array of claim 5, wherein a supporting structure is provided between the first segment of the first gate electrode and the second segment of the second gate electrode.

8. The vertical memory cell array of claim 7, wherein the supporting structure has a high etching selectivity with respect to borosilicate glass.

9. A method for fabricating vertical memory cells each containing a selection transistor and a storage capacitor comprising:

introducing deep trenches into a semiconductor substrate from a substrate surface;

arranging an inner electrode of a storage capacitor in a lower region of the deep trenches;

providing a capacitor termination in each case on the inner electrodes, introducing active trenches that insulate memory cells that are arranged in adjacent rows from one another;

filling the active trenches with an auxiliary structure up to an auxiliary filling height; and forming addressing lines for driving the selection transistors in the active trenches, wherein the addressing lines are formed essentially above the auxiliary filling height, so that a lower edge of the addressing lines is set by choice of the auxiliary filling height.

10. The method of claim 9, wherein the choice of the height of the auxiliary structure is used to set an electrode overlap region between a respective one of the addressing lines and an assigned inner electrode.

11. The method of claim 9, wherein the choice of the height of the auxiliary structure is used to set a source/drain overlap region between a respective one of the addressing lines and a lower source/drain region connected to the assigned inner electrode of one of the selection transistors.

12. The method of claim 9, wherein the active trenches are filled with the auxiliary structures essentially as far as the capacitor termination.

13. The method of claim 9, wherein the capacitor terminations are provided as a doped insulator layer, and wherein weakly doped regions that extend the lower source/drain regions are formed by outdiffusion from the doped insulator layer.

14. The method of claim 9, further comprising:

forming sacrificial spacer structures extending along sidewalls of the deep trenches above the capacitor terminations;

filling the deep trenches provided with the sacrificial spacer structures with a supporting structure;

removing the sacrificial spacer structures after the introduction of the active trenches, wherein voids remaining place of the sacrificial spacer structures;

providing a gate oxide that lines the active trenches and the voids at least in segments; and filling the voids produced by the removal of the sacrificial spacer structures at the same time as an application of a material of the addressing lines, so that segments of the gate electrodes are formed in the filled voids.

15. The method of claim 14, wherein, before the sacrificial spacer structures are formed, a liner layer is applied at least to the sidewalls of the deep trenches above the capacitor termination.

16. The method of claim 14, wherein forming the sacrificial spacer structures comprises:

depositing a dielectric material; and anisotropic etching of the dielectric material to below the substrate surface.

17. The method of claim 14, wherein the material of the addressing lines is patterned by means of an anisotropic etching step, so that, in an active trench, mutually opposite addressing lines are separated from one another by a gap.

18. The method of claim 14, further comprising:

filling the gap with an insulating material;

causing the addressing lines to recede to below the substrate surface; and forming the upper source/drain regions in the semiconductor substrate relative to an upper edge of the addressing lines.

19. The method of claims 14, further comprising:

performing an inclined implantation of the semiconductor substrate with a dopant, wherein the inclined implantation is aligned by means of the upper edge of the addressing lines in order to form the upper source/drain regions.

* * * * *